United States Patent [19]

Sundby

[11] Patent Number: 5,325,069
[45] Date of Patent: Jun. 28, 1994

[54] CMOS OPAMP WITH LARGE SINKING AND SOURCING CURRENTS AND HIGH SLEW RATE

[75] Inventor: James T. Sundby, Tracy, Calif.

[73] Assignee: Exar Corporation, San Jose, Calif.

[21] Appl. No.: 998,153

[22] Filed: Dec. 29, 1992

[51] Int. Cl.⁵ .................................................. H03F 3/45
[52] U.S. Cl. ..................................... 330/253; 330/258
[58] Field of Search ............... 330/253, 255, 258, 277, 330/296, 261

[56] References Cited

PUBLICATIONS

Fisher, John A. "A High-Performance CMOS Power Amp" IEEE J. S.S. Ckts., vol. SC-20 No. 6, Dec. 1985 pp. 1200-1205.

Ribner, David B. et al., "Design Techniques for Cascaded CMOS Op Amps" IEEE J. S.S. Ckts., vol. SC-19 No. 6, Dec. 1984 pp. 919-925.

A Programmable Gain/Loss Circuit by J. Babanezhad and R. Gregorian, *IEEE Journal of Solid State Circuits,* Dec. 1987, p. 1087, Fig. 7(a).

*Primary Examiner*—Steven Mottola
*Attorney, Agent, or Firm*—Townsend and Townsend Khourie and Crew

[57] ABSTRACT

A CMOS opamp having large sinking and sourcing currents, and capable of driving high capacitive loads. The CMOS opamp improves a prior art OPAMP that includes a folded cascode gain stage and a class A/B output stage. By inserting a source follower stage between the folded cascode stage and the output stage, the opamp can drive very large capacitive loads that can also compensate the opamp. By further modifying the output stage, the ability to sink load current is vastly improved.

5 Claims, 6 Drawing Sheets

CMOS OPAMP WITH LARGE SINKING AND SOURCING CURRENTS AND HIGH SLEW RATE

BACKGROUND OF THE INVENTION

The present invention relates in general to CMOS opamp circuits, and in particular, to CMOS opamps with a class A/B output stage capable of driving high capacitive loads.

An example of a prior art CMOS opamp with a class A/B output stage can be found in the Journal of Solid State Circuits, Dec. 1987, page 1087, FIG. 7(a) of the article "A programmable Gain/Loss Circuit," by J. Babanezhad and R. Gregorian. The prior art opamp includes a folded cascode gain stage followed by a class A/B output stage. This opamp was designed for use in a programmable gain/loss circuit where high gain and large bandwidth were required for an opamp driving capacitive loads of relatively modest size.

While this prior art opamp performs well for the particular application, it suffers from several disadvantages. First, in many applications, opamps are required to drive very large capacitive loads where the load capacitor provides the dominant pole. Often, under such circumstances, the Miller capacitance and the zero-nulling resistor are removed to allow the load capacitance to provide the necessary frequency compensation. However, the pole created by the combination of the high impedance node at the output of the folded cascode input stage and the large gate capacitances (of output transistors) connected to that node, makes it very difficult to stabilized this opamp with a load capacitor.

Second, in applications requiring very large output devices this opamp would experience slew rate limiting. This is due to the output of the folded cascode stage directly connecting to the gate of a PMOS pull-up transistor that drives the output node. For a larger output transistor (i.e. higher gate capacitance), therefore, the folded cascode must provide larger amounts of current. However, increased currents reduce the impedance at the output of the folded cascode, which results in loss of overall gain.

Another disadvantage of this prior art opamp is its limited current sinking capability. The biasing of the output stage allows the gate of the common-source PMOS transistor driving the output node to have a large voltage swing, while the common-source NMOS transistor driving the output experiences a very limited voltage swing at its gate. As a result, the output stage can source much more current than it can sink.

SUMMARY OF THE INVENTION

The CMOS opamp of the present invention provides an improved class A/B output stage for a high gain, large bandwidth CMOS opamp presented in the prior art.

The improved output stage of the CMOS opamp of the present invention allows the opamp to drive larger capacitive loads, with the load capacitor providing the necessary frequency compensation. This is accomplished by removing the internal compensation capacitor, and adding a source follower transistor between the folded cascode gain stage and the class A/B output stage. Acting as a buffer, the source follower transistor effectively insulates the high impedance folded cascode output node from the large capacitance associated with the gate of the output transistor. This causes the pole created at that node to be pushed out into much higher frequencies, which allows for the load capacitor to stabilize the frequency response of the opamp. The load capacitor must of course be above a certain lower limit to insure stability. However, there would be no upper limit.

The insertion of a source follower transistor between the output of the folded cascode stage and the input of the class A/B output stage also reduces the amount of current required from the folded cascode for slewing. Because the output of the folded cascode no longer has to drive the gate of the output transistor, the amount of current supplied by the folded cascode need not increase as the size of the output transistors increase. This allows the input stage to maintain its high gain characteristic, while the output stage enjoys large output transistors.

The class A/B output stage of the CMOS opamp of the present invention also improves the current sinking capability of the opamp. The biasing circuit for the output stage that sets the quiescent current is modified such that the gate of the common source NMOS transistor driving the output experiences a larger voltage swing. A larger voltage swing at the gate of the common source NMOS output transistor allows the transistor to sink more load current.

For lower load capacitances, the internal compensation capacitor can be used to form the dominant pole, while still enjoying the slow rate and current sinking advantages of the improved output stage. Of course, there would now be an upper limit on the load capacitor to insure stability. However, there would be no lower limit for the load capacitor.

A further understanding of the CMOS opamp of the present invention may be had with reference to the description and diagrams below.

DESCRIPTION OF THE PREFERRED EMBODIMENT

Figure 1:
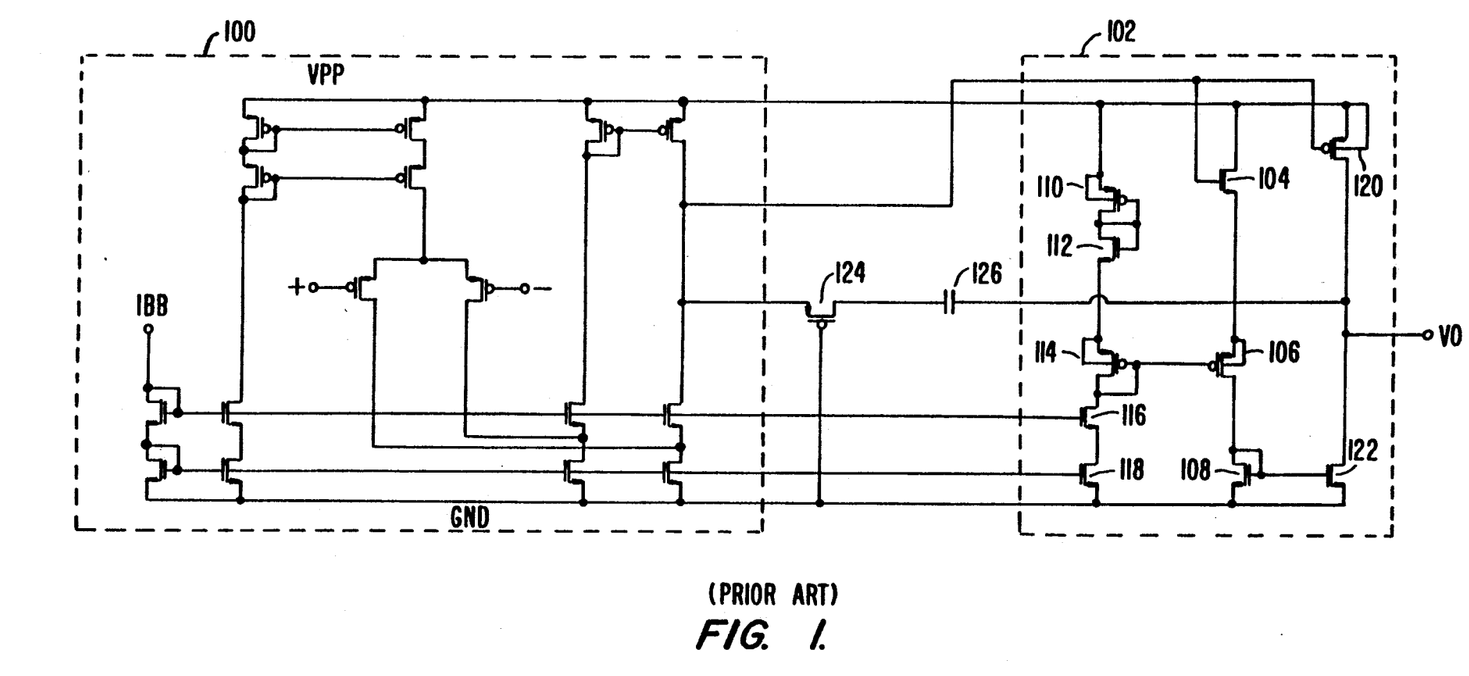
FIG. 1 is a circuit diagram of a prior art CMOS opamp with a folded cascode gain stage and class A/B output stage.

FIG. 1 shows a prior art CMOS opamp having a folded cascode gain stage 100 and a class A/B output stage 102. Input stage 100 is a typical folded cascode structure with PMOS inputs. Output stage 102 includes an NOS input transistor 104 which receives the output of the folded cascode input stage 100 at its gate terminal. The drain of NMOS 104 connects to the power supply Vpp, and the source connects to a source terminal of a PMOS transistor 106. PMOS 106 receives a bias signal at its gate terminal from a bias string of transistors 110 through 118. This bias string of transistors sets the quiescent current for output stage 102. A diode connected NMOS transistor 108 connects to PMOS 106 and a pull-down NMOS output transistor 122 such that it mirrors the current in PMOS 106 into output NMOS 122. A drain terminal of a pull-up PMOS output transistor 120 connects to a drain terminal of NMOS 122, while its gate terminal connects to the output of the folded cascode input stage. Transistors 120 and 122 drive the output of the opamp. Capacitor 126 and PMOS transistor 124 act as miller capacitor and zero-nulling resistor respectively, and provide the frequency compensation of the opamp.

This opamp is capable of driving a 5 pF load capacitor, and with some modifications (as in FIG. 7(b) of the Babanezhad article) can drive capacitive loads as high as 100 pF. As the capacitive load at the output increases, the phase margin deteriorates, and it becomes more difficult to internally compensate this opamp. Frequency compensation would therefore have to be performed by the load capacitor. However, the parasitic gate capacitances of NMOS 104 and output transistor PMOS 120 (which could be a very large transistor) connecting to the output of the folded cascode gain stage (which is a high impedance node) create a pole that makes it more difficult for a load capacitor to provide adequate phase margin. Also, the output of the folded cascode gain stage directly connects to the gate of PMOS output transistor 120. Therefore, unless the input stage supplies more current, the slewing capability of the opamp will be severely limited as the output transistor grows in size. To maintain the same slew rate in applications where larger output devices are required, the input stage must supply more current which would reduce the overall gain of the opamp.

Figure 2:
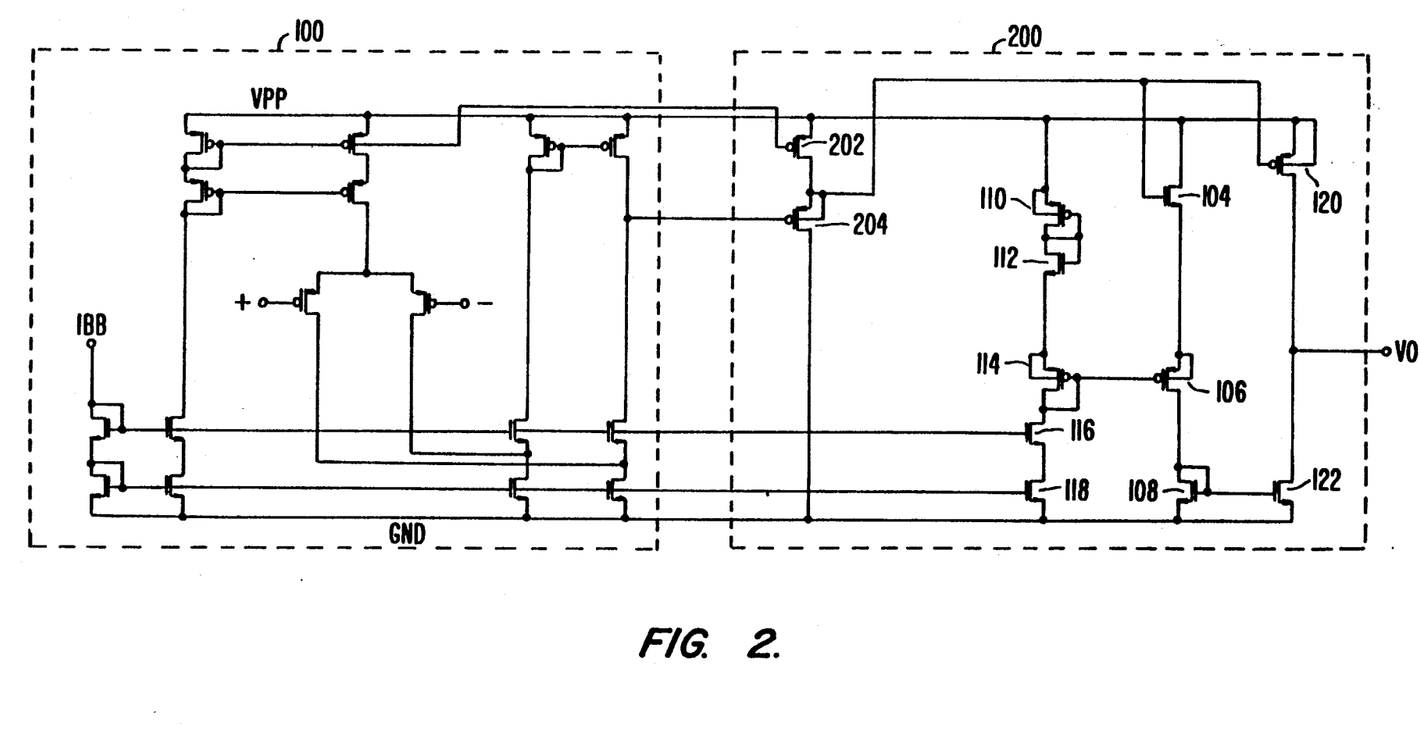
FIG. 2 is a circuit diagram of the CMOS opamp according to one embodiment of the present invention having a class A/B output stage with improved slew rate and frequency compensation mechanism (for large load capacitances)

FIG. 2 shows a CMOS opamp according to one embodiment of the present invention. The opamp includes the folded cascode gain stage 100 of the prior art CMOS opamp. A class A/B output stage 200 includes all of the same transistors as in the prior art output stage 102 (transistors 104 through 122) plus a PMOS source follower 204 and a PMOS transistor 202 acting as the source current source for PMOS 204. Instead of directly connecting to the gate of output transistor 120, now the output of the folded cascode 100 only drives the gate of PMOS source follower 204. The drain terminal of PMOS 204 connects to ground, while it's source is connected to PMOS 202. The source terminal of PMOS 204 also connects to the gates of transistors 104 and 120. In this fashion, the high impedance node at the output of folded cascode 100 is isolated from the large capacitances associated with NMOS 104 and output transistor 120. Therefore, larger output devices will not affect the slewing rate. Source follower PMOS 204 is much smaller in size than NMOS 104 and PMOS 120, therefore the output of folded cascode 100 sees much less capacitance. As a result, the pole created by the high impedance node at the output of folded cascode 100 is now pushed out to much higher frequencies. The internal compensation (PMOS 124 and resistor 126) has been removed, allowing for a load capacitor to adequately compensate the opamp. This opamp will be stable for arbitrarily high values of load capacitances.

The output stage 102 of the prior art CMOS opamp depicted in FIG. 1 suffers from an imbalance in its current sinking and sourcing ability. Under normal biasing conditions, the DC operating point of the opamp places the output of the folded cascode 100 close to Vpp. This node, which connects to the gate of PMOS output transistor 120, swings down to few tens of millivolts above ground. PMOS 120, therefore, experiences a very large Vgs, allowing output stage 102 to source a large amount of current. However, the gate of NMOS 104 is also connected to the output of folded cascode 100 and is therefore normally biased near Vpp. Therefore, the window within which the turn on voltage at the gate of NMOS 104 can swing is very small. As a result, NMOS 104 experiences a much smaller Vgs when the output of folded cascode 100 is at its maximum, compared to the Vgs of PMOS 120 when the output of folded cascode 100 is at its minimum. Since NMOS 104 sets the current for the NMOS pull-down transistor 122, NMOS 122 has a limited current sinking ability.

Figure 3:
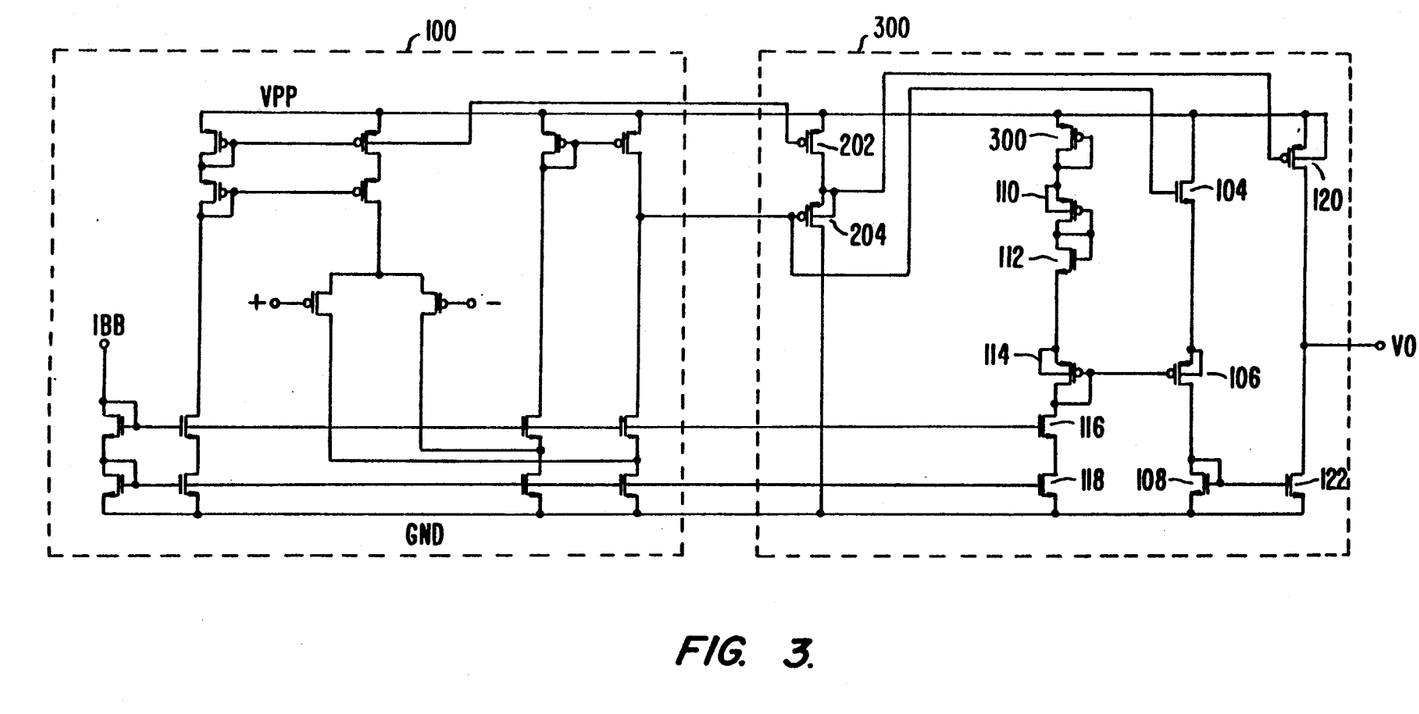
FIG. 3 is a circuit diagram of the CMOS opamp according to another embodiment of the present invention having a class A/B output stage with improved current sinking capability.

The CMOS opamp according to the embodiment of the present invention depicted in FIG. 2, lowers the amount of current output stage 200 can source by decreasing the voltage swing at the gate of PMOS 120 by one threshold voltage (Vt of source follower PMOS 204). This is not a problem since the opamp has large current sourcing capacity. However, the current sinking ability of the opamp remains limited. FIG. 3 shows another embodiment of the CMOS opamp of the present invention with circuitry to improve the current sinking capability of the opamp. Instead of connecting to the gate of PMOS 120 (and source of PMOS 204), the gate of NMOS 104 now directly connects to the output of folded cascode 100 (and gate of PMOS 204). This way the gate of NMOS 104 is biased further below Vpp by one PMOS threshold voltage (Vt of source follower PMOS 204). This allows transistor 104 to experience a larger voltage swing at its gate which translates to more current in NMOS 122. To maintain the proper amount of quiescent current in output stage 300, the bias voltage generated by the bias string must be adjusted accordingly. Therefore, diode-connected PMOS transistor 300 is added between PMOS 110 and Vpp to provide the necessary voltage level shifting.

Figure 4:
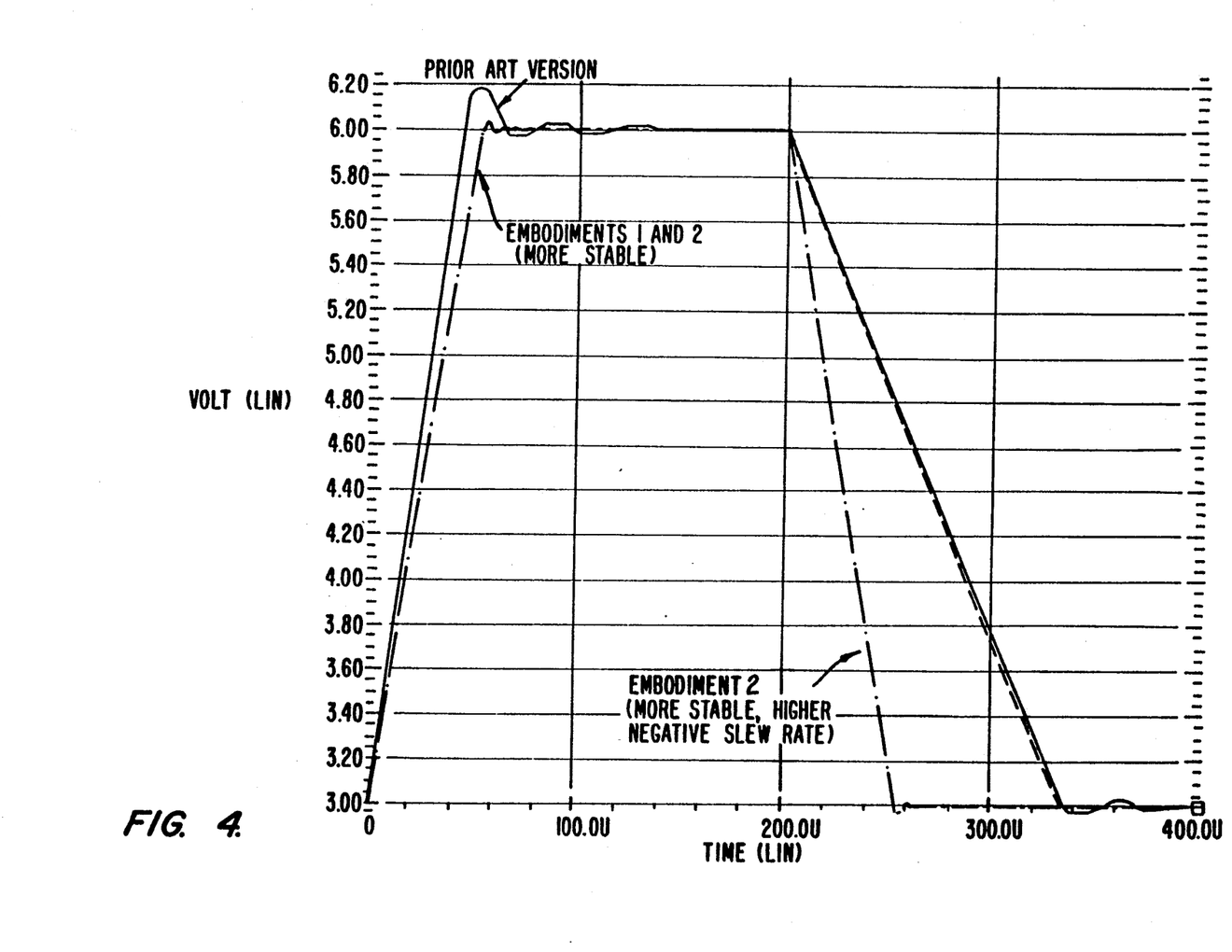
FIG. 4 shows the results of a circuit simulation program comparing the slew rate of prior art opamp to the two embodiments of the present invention by testing a step response of each opamp.
Figure 5:
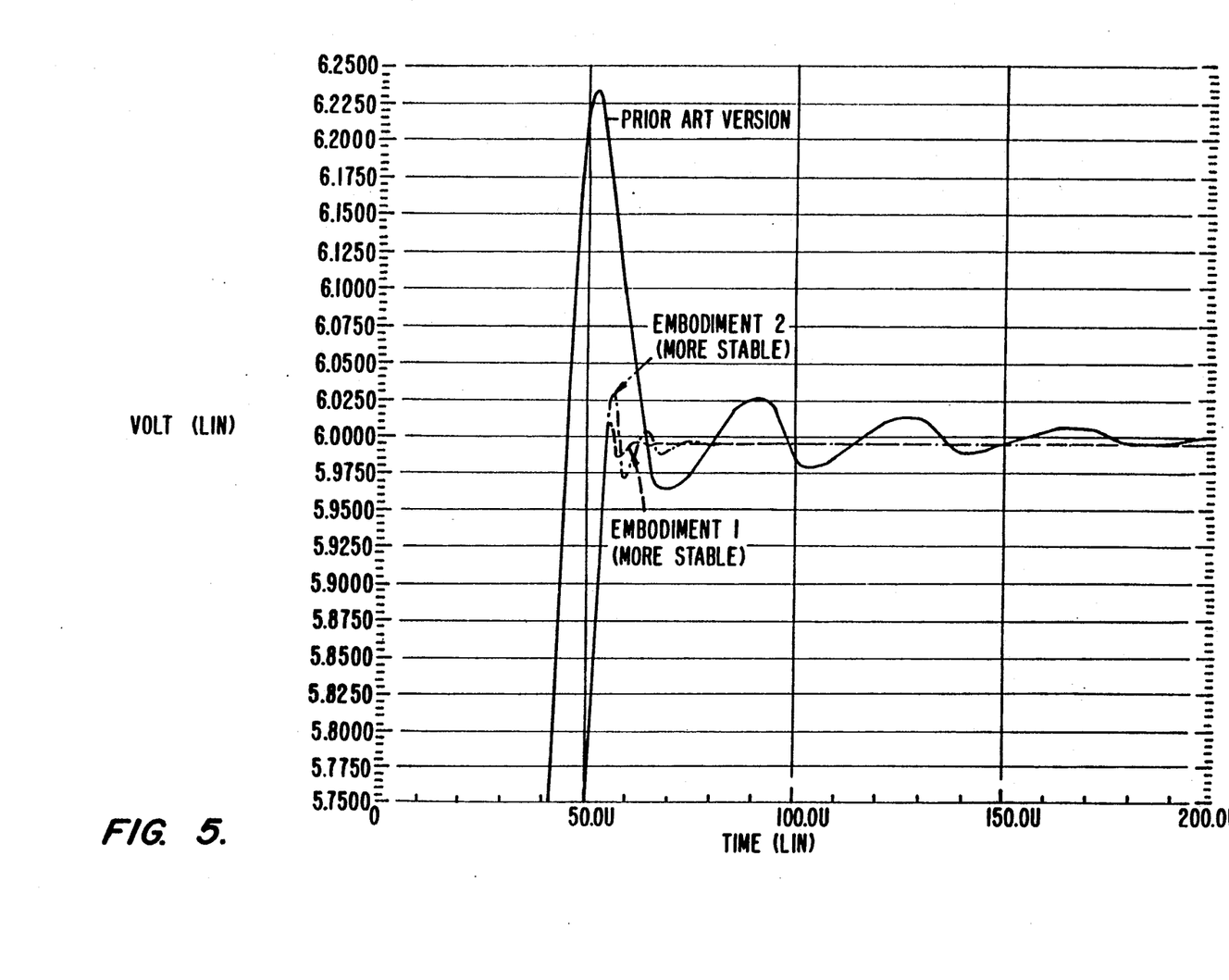
FIG. 5 shows the results of a circuit simulation program comparing the stability of the prior art opamp to the two embodiments of the present invention by testing a step response of each opamp.
Figure 6:
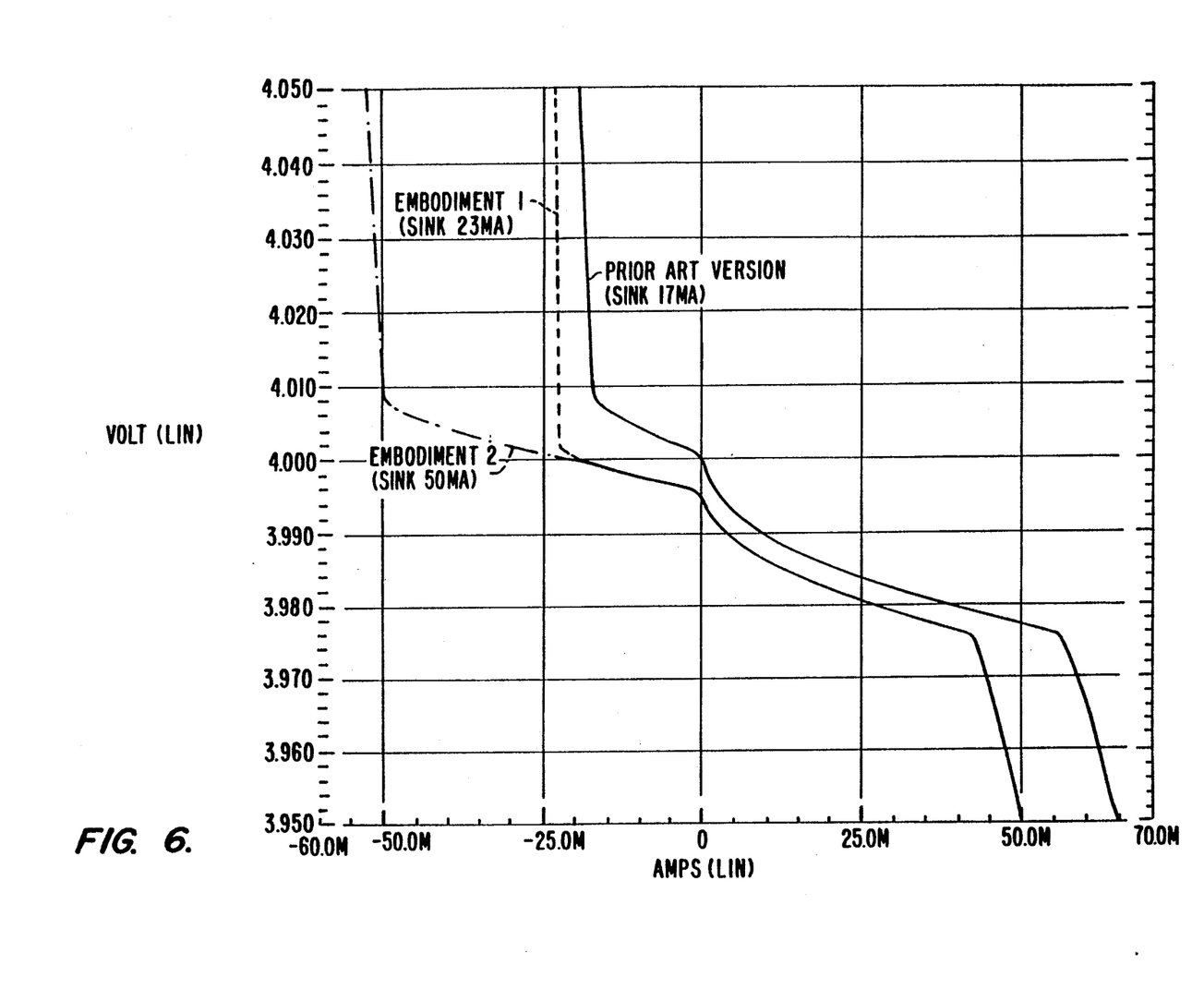
FIG. 6 shows the results of a circuit simulation program comparing the current sinking and sourcing ability of the prior art opamp to the two embodiments of the present invention.

FIG. 4 illustrates the slew rate for the two embodiments of the CMOS opamp of the present invention as compared to the prior art CMOS opamp. The slew rate and stability of the opamps are measured by analyzing their step responses while driving a 1μF capacitive load. For a more accurate comparison the internal compensation capacitor of the prior art opamp is removed and replaced by the 1μF load capacitor. As can be seen from the diagram, the CMOS opamp of the present invention has a slightly lower positive slew rate, but a considerably higher negative slew rate. The slight decrease in positive slew rate was traded off with a more stable step response (less overshoot). FIG. 6 magnifies the rising edge of the step response to clearly illustrate the improvement in the opamp stability. The prior art CMOS opamp demonstrates a 0.2v overshoot, whereas the CMOS opamp of the present invention according to the first embodiment (FIG. 2) has approximately 0.005v overshoot, and the second embodiment a 0.025v overshoot.

FIG. 6 compares the current sourcing and sinking ability of the three opamps. The prior art CMOS opamp can sink a maximum current of 17mA and source a maximum current of 70mA. The CMOS opamp of the present invention according to the first embodiment (FIG. 2) improves the current sinking capability of the opamp by 7mA(total of about 24mA), but reduces the current sourcing power to 50mA. The CMOS opamp of the present invention according to the second embodiment (FIG. 3) balances the current sinking and sourcing of the opamp by more than doubling the current sinking ability of the opamp to about 50mA.

In conclusion, the present invention offers several enhancements to a prior art CMOS opamp having large bandwidth and high gain. The enhancements provided by the present invention allow the opamp to be compensated externally (by a load capacitor), improve the slew rate, and increase the current sinking capability of the opamp. It is also possible to enjoy the same improved slew rate and current sinking capability while still compensating internally. In this case there would be an upper limit on the allowable load capacitance. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A CMOS operational amplifier coupled between a first and a second power supply voltage, comprising:
   a folded cascode gain stage;
   an output stage biasing transistor string including:
      a first diode-connected PMOS transistor having a source terminal coupled to the first power supply voltage,
      an NMOS diode-connected transistor having a gate and drain terminal coupled to a gate and drain terminal of a said first PMOS diode-connected transistor,
      a second diode-connected PMOS transistor having a source terminal coupled to a source terminal of said diode-connected NMOS transistor, and
      a first current source device coupling a gate and drain of said second diode-connected PMOS transistor to the second power supply terminal;
   an output stage level shift transistor string including:
      an NMOS source follower transistor having a drain terminal coupled to the first power supply voltage,
      a PMOS bias transistor having a source terminal coupled to a source terminal of said NMOS source follower transistor, and a gate terminal coupled to said second diode-connected PMOS transistor gate terminal, and
      a diode-connected NMOS current mirroring transistor having a gate and drain terminal coupled to a drain terminal of said PMOS bias transistor, and a source terminal coupled to the second power supply voltage;
   an output stage output transistor string including:
      a common source PMOS pull-up transistor having a gate terminal coupled to a gate terminal of said NMOS source follower transistor, and a drain terminal coupled to the opamp output, and
      a common source NMOS pull-down transistor having a gate terminal coupled to said gate terminal of said diode-connected NMOS current mirroring transistor, and a drain terminal coupled to the opamp output;
   a PMOS source follower transistor having a drain terminal coupled to the second power supply voltage, a source terminal coupled to said gate terminal of said NMOS source follower transistor, and a gate terminal coupled to an output of said folded cascode gain stage; and
   a second current source device coupling said PMOS source follower transistor source terminal to the first power supply voltage.

2. A CMOS operational amplifier coupled between a first and a second power supply voltage, comprising:
   a folded cascode gain stage;
   an output stage biasing transistor string including:
      a first diode-connected PMOS transistor having a source terminal coupled to the first power supply voltage,
      a second diode-connected PMOS transistor having a source terminal coupled to a gate and drain terminal of said first diode-connected PMOS transistor;
      an NMOS diode-connected transistor having a gate and drain terminal coupled to a gate and drain terminal of a said second PMOS diode-connected transistor,
      a third diode-connected PMOS transistor having a source terminal coupled to a source terminal of said diode-connected NMOS transistor, and
      a first current source device coupling a gate and drain of said third diode-connected PMOS transistor to the second power supply terminal;
   an output stage level shift transistor string including:
      an NMOS source follower transistor having a drain terminal coupled to the first power supply voltage,
      a PMOS bias transistor having a source terminal coupled to a source terminal of said NMOS source follower transistor, and a gate terminal coupled to said third diode-connected PMOS transistor gate terminal, and
      a diode-connected NMOS current mirroring transistor having a gate and drain terminal coupled to a drain terminal of said PMOS bias transistor, and a source terminal coupled to the second power supply voltage;
   an output stage output transistor string including:
      a common source PMOS pull-up transistor having a drain terminal coupled to the opamp output, and
      a common source NMOS pull-down transistor having a gate terminal coupled to said gate terminal of said diode-connected NMOS current mirroring transistor, and a drain terminal coupled to the opamp output;
   a PMOS source follower transistor having a drain terminal coupled to the second power supply voltage, a source terminal coupled to a gate terminal of said common source PMOS pull-up transistor, and a gate terminal coupled to a gate terminal of said output stage source follower NMOS transistor; and
   a second current source device coupling said second PMOS source follower transistor source terminal to the first power supply voltage.

3. A CMOS operational amplifier comprising:

a folded cascode gain stage;
a source follower transistor having an input terminal coupled to an output of said gain stage;
level shift means having an input transistor with a gate terminal coupled to a source terminal of said source follower transistor;
biasing means coupled to a bias input of said level shift means;
a pull-down transistor having a gate terminal coupled to an output of said level shift means and an output terminal coupled to an output of the amplifier; and
a pull-up transistor having a gate terminal coupled to said source follower transistor and an output terminal coupled to said output of the amplifier.

4. The CMOS operational amplifier of claim 3 wherein said gate terminal of said pull-up transistor couples to said input terminal of said source follower transistor.

5. The CMOS operational amplifier of claim 3 wherein said gate terminal of said pull-up transistor couples to said source terminal of said source follower transistor.

* * * * *